United States Patent
Ringe et al.

(10) Patent No.: US 10,802,534 B2
(45) Date of Patent: Oct. 13, 2020

(54) CLOCK CIRCUITRY WITH FAULT DETECTION

(71) Applicant: Arm Limited, Cambridge (GB)

(72) Inventors: Tushar P. Ringe, Austin, TX (US); Ramamoorthy Guru Prasadh, Austin, TX (US); Amaresh Pangal, Austin, TX (US); Kishore Kumar Jagadeesha, Austin, TX (US); Mark David Werkheiser, Austin, TX (US)

(73) Assignee: Arm Limited, Cambridge (GB)

( * ) Notice: Subject to any disclaimer, the term of this patent is extended or adjusted under 35 U.S.C. 154(b) by 78 days.

(21) Appl. No.: 16/256,675

(22) Filed: Jan. 24, 2019

(65) Prior Publication Data

US 2020/0241589 A1    Jul. 30, 2020

(51) Int. Cl.
| | | |
|---|---|---|
| G06F 1/10 | (2006.01) | |
| G06F 1/08 | (2006.01) | |
| H03L 7/091 | (2006.01) | |
| H03L 7/081 | (2006.01) | |
| G06F 1/24 | (2006.01) | |

(52) U.S. Cl.
CPC ............... G06F 1/10 (2013.01); G06F 1/08 (2013.01); H03L 7/0812 (2013.01); H03L 7/091 (2013.01); G06F 1/24 (2013.01)

(58) Field of Classification Search
CPC ............... G06F 1/10; G06F 1/08; G06F 1/24
See application file for complete search history.

(56) References Cited

U.S. PATENT DOCUMENTS

| | | | |
|---|---|---|---|
| 8,677,172 B2* | 3/2014 | Anderson | G01R 31/31726 713/500 |
| 8,966,432 B1* | 2/2015 | Klein | G06F 30/327 716/134 |
| 9,973,331 B1* | 5/2018 | Rosen | H03L 7/00 |
| 10,082,824 B2* | 9/2018 | Mangano | G06F 1/14 |
| 2003/0101396 A1* | 5/2003 | Price | G01R 31/31832 714/726 |

(Continued)

OTHER PUBLICATIONS

C. Yu, "A Clock Fault Detection Circuit for Reliable High Speed System by Time-to-Voltage Conversion," 2009 Second International Symposium on Electronic Commerce and Security, Nanchang, 2009, pp. 283-286. (Year: 2009).*

(Continued)

*Primary Examiner* — Cynthia Britt
(74) *Attorney, Agent, or Firm* — Pramudji Law Group PLLC; Ari Pramudji

(57) ABSTRACT

Various implementations described herein refer to an integrated circuit having first clock circuitry that receives a first clock signal and provides sampled offset pulses associated with the first clock signal when enabled with enable signals. The integrated circuit may include second clock circuitry that receives a second clock signal and provides the enable signals to the first clock circuitry based on the second clock signal. The integrated circuit may include fault detector circuitry that receives the sampled offset pulses from the first clock circuitry, receives the enable signals from the second clock circuitry, and provides one or more error flags for detected faults of the first clock signal based on the sampled offset pulses from the first clock circuitry and based on the enable signals from the second clock circuitry.

25 Claims, 13 Drawing Sheets

(56) References Cited

U.S. PATENT DOCUMENTS

| | | | | |
|---|---|---|---|---|
| 2005/0200393 | A1* | 9/2005 | Furtner | H03L 7/22 |
| | | | | 327/291 |
| 2006/0047459 | A1* | 3/2006 | Underbrink | G01S 19/23 |
| | | | | 702/117 |
| 2006/0250160 | A1* | 11/2006 | Chang | G06F 1/06 |
| | | | | 326/93 |
| 2006/0280272 | A1* | 12/2006 | Stojanovic | H04L 7/0334 |
| | | | | 375/355 |
| 2013/0003905 | A1* | 1/2013 | Jain | H03K 5/1534 |
| | | | | 375/360 |
| 2015/0033101 | A1* | 1/2015 | Chebruch | G06F 11/0751 |
| | | | | 714/798 |
| 2018/0091128 | A1* | 3/2018 | Lau | H03K 5/1565 |

OTHER PUBLICATIONS

C. Metra, M. Omana, T. M. Mak and S. Tam, "New Design for Testability Approach for Clock Fault Testing," in IEEE Transactions on Computers, vol. 61, No. 4, pp. 448-457, Apr. 2012. (Year: 2012).*

F. E. Potestad-Ordóñez, C. J. Jiménez-Fernández and M. Valencia-Barrero, "Experimental and timing analysis comparison of FPGA trivium implementations and their vulnerability to clock fault injection," 2016 Conference on Design of Circuits and Integrated Systems (DCIS), Granada, 2016, pp. 1-6. (Year: 2016).*

Q. Wang, F. Droz and P. Rochat, "Robust clock ensemble for time and frequency reference system," 2015 Joint Conference of the IEEE International Frequency Control Symposium & the European Frequency and Time Forum, Denver, CO, 2015, pp. 374-378. (Year: 2015).*

* cited by examiner

CLOCK CIRCUITRY WITH FAULT DETECTION

BACKGROUND

This section is intended to provide information relevant to understanding the various technologies described herein. As the section's title implies, this is a discussion of related art that should in no way imply that it is prior art. Generally, related art may or may not be considered prior art. It should therefore be understood that any statement in this section should be read in this light, and not as any admission of prior art.

Conventional functionally-safe (FuSa) systems can have stringent safety goals in the industry. These FuSa systems typically deploy clock methodology with fault detection that relies on monitoring a primary clock with respect to a synchronous reference clock to capture differences in counter values over time. In large systems, where clock checkers are placed throughout the system, multiple clock trees can pose significant problems since two independent clocks (primary clock and reference clock) need to be balanced across the system, which may not be feasible without degraded power/area/time metrics.

BRIEF DESCRIPTION OF THE DRAWINGS

Implementations of various metal layout techniques are described herein with reference to the accompanying drawings. It should be understood, however, that the accompanying drawings illustrate only various implementations described herein and are not meant to limit embodiments of various techniques described herein.

DETAILED DESCRIPTION

Various implementations described herein are directed to various schemes and techniques for providing clock circuitry for functionally-safe (FuSa) systems where faults are detected on a primary clock by a reference clock that does not need to be skew-managed with respect to the primary clock to thereby relax the clock tree synthesis requirements. For instance, various schemes and techniques described herein are directed to a clock methodology for providing a dual-edge triggered glitch detection circuit that detects stuck-at faults and transient faults on a clock tree using a mesochronous reference clock having the same frequency with a different phase as a primary clock. The various schemes and techniques described herein provide for a reference clock that does not need to be skew-balanced with respect to the primary clock for fault detection on the primary clock tree to thereby improve power/area metrics associated with FuSa systems. As such, various schemes and techniques described herein provide for a primary clock (CLK) that is monitored for stuck-at faults and/or transient faults and a reference clock (CLK_CHK) having the same frequency as the primary clock (CLK) with a different phase (i.e., mesochronous clocks).

Various implementations of schemes and techniques for providing clock circuitry with fault detection will now be described in greater detail herein in FIGS. 1A-6.

Figure 1A:
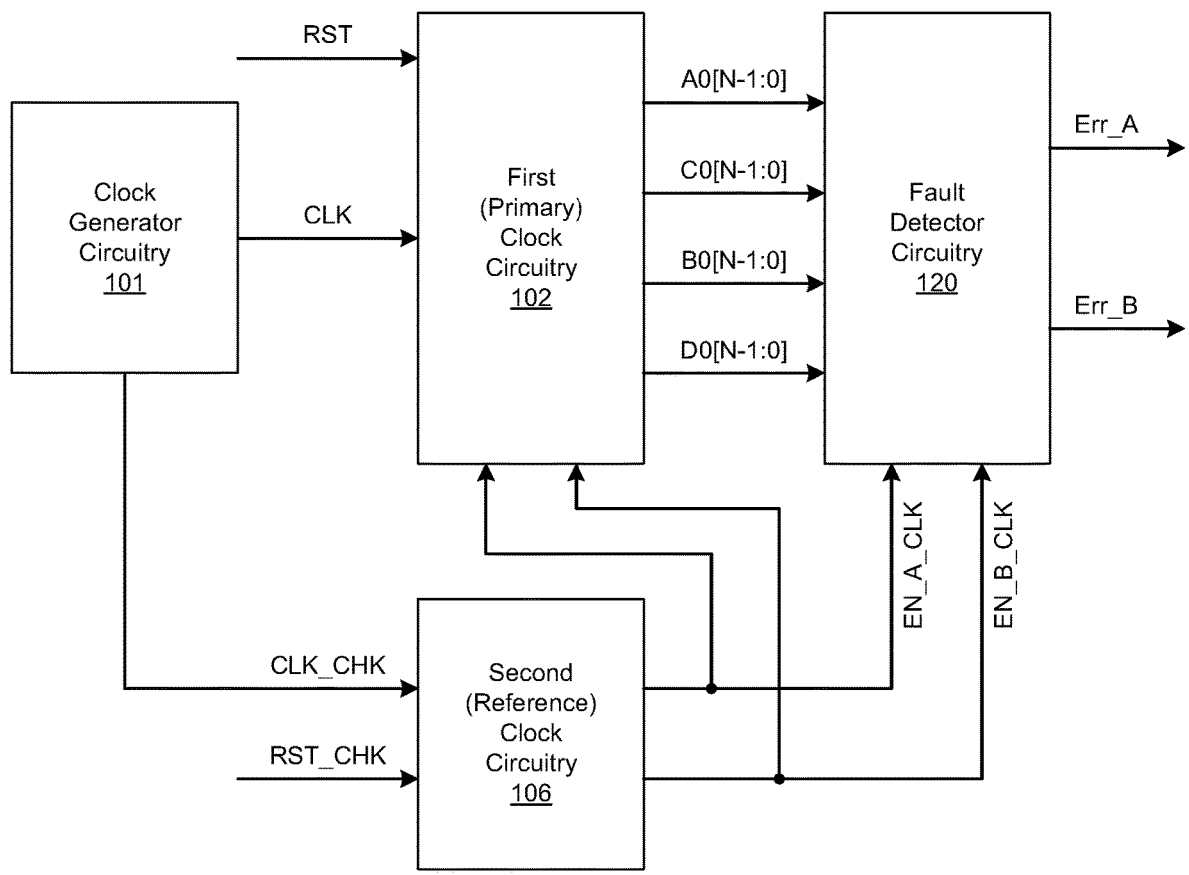
FIGS. 1A-1C illustrate diagrams of clock checker circuitry having fault detection in accordance with implementations described herein.
Figure 1B:
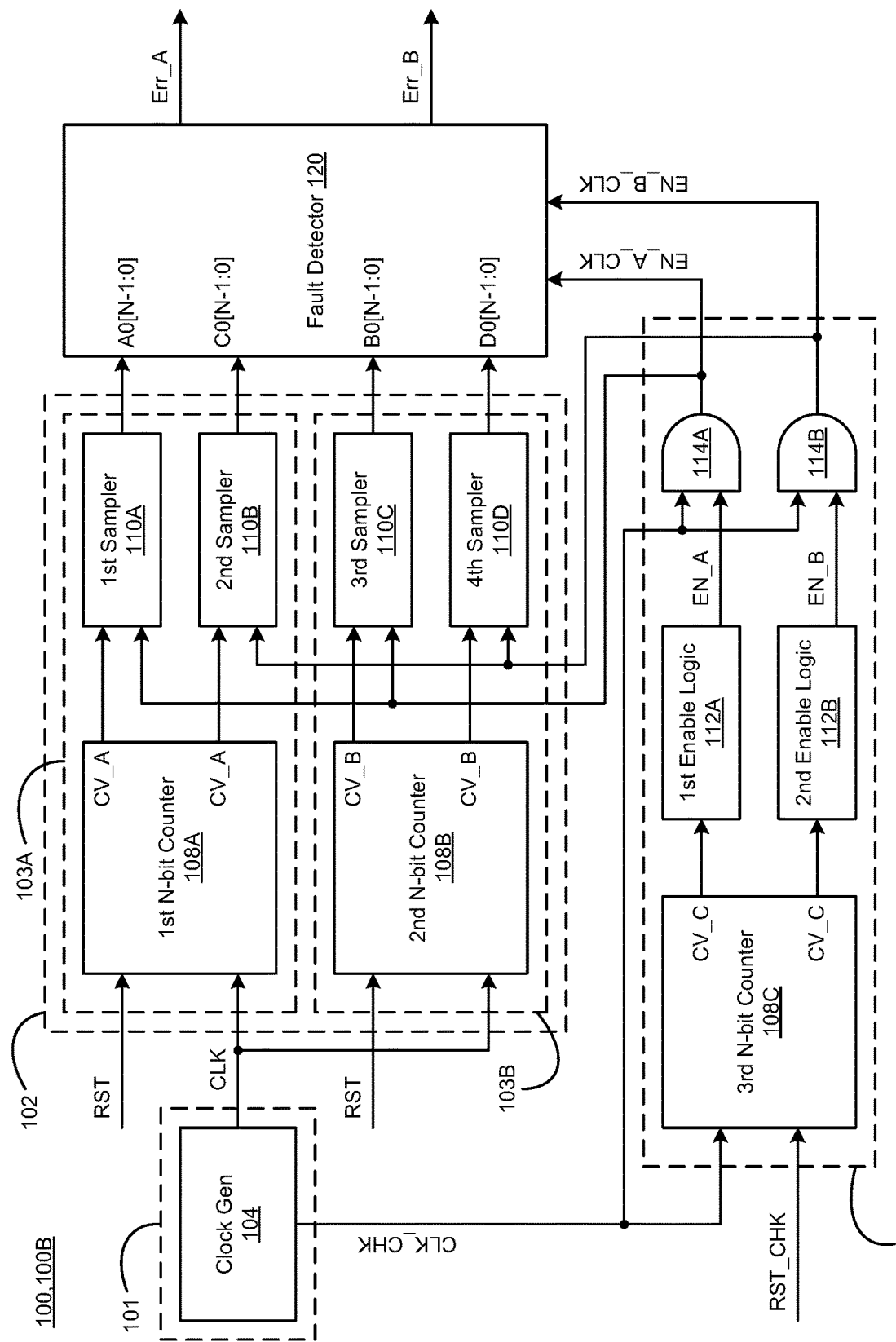
Figure 1C:
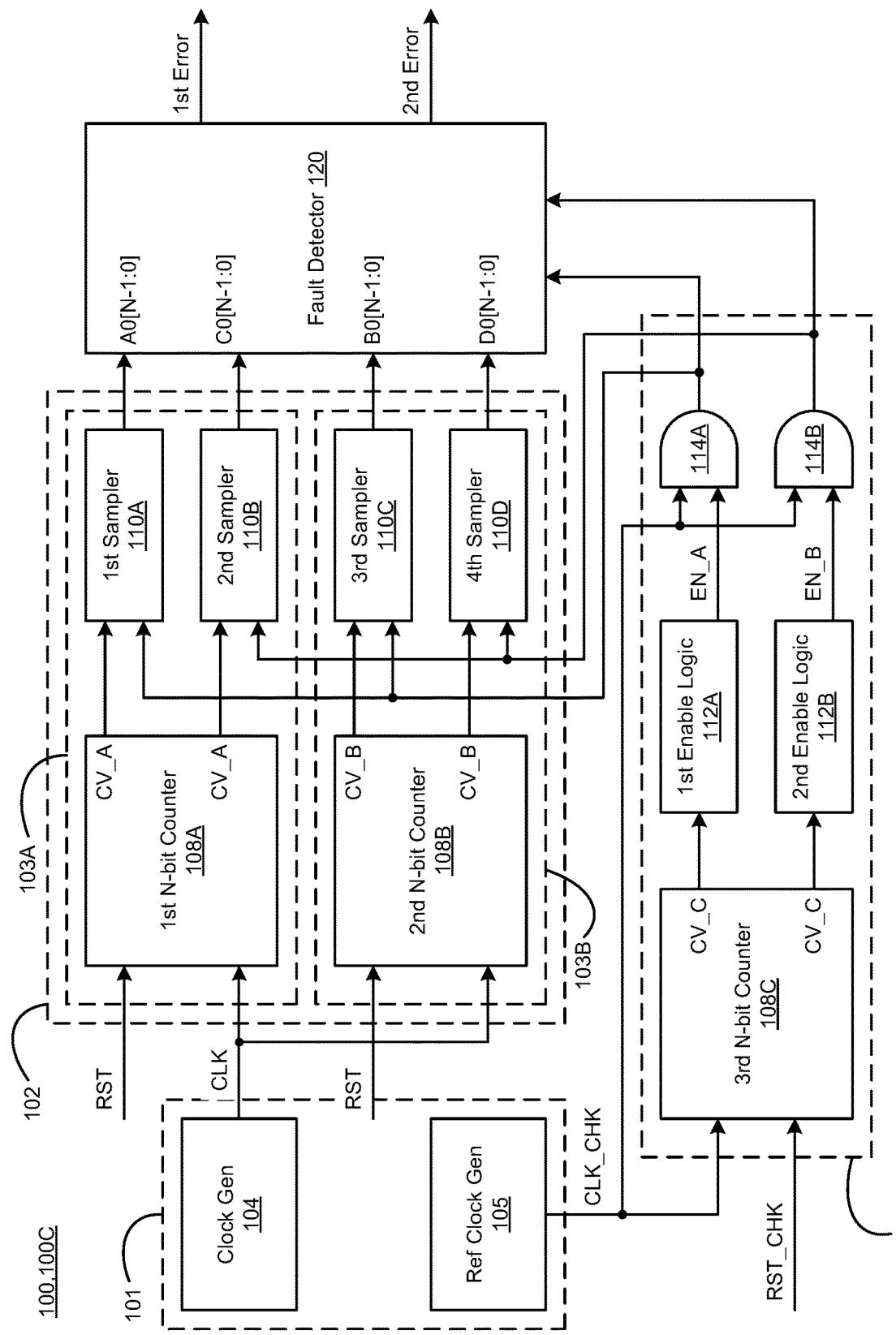

FIGS. 1A-1C illustrate various diagrams of clock checker circuitry 100 with fault detection in accordance with various implementations described herein. In particular, FIG. 1A shows a diagram 100A of the clock checker circuitry 100 with fault detector circuitry 120, FIG. 1B shows a diagram 100B of the clock checker circuitry 100 with the clock generator circuitry 101 and the fault detector circuitry 120, and FIG. 1C shows another diagram 100C of the clock checker circuitry 100 with multiple clock generator circuitry 104, 105 and the fault detector circuitry 120.

As shown in FIG. 1A, the clock checker circuitry 100 may include clock generator circuitry 101 that provides a first clock signal (CLK) and a second clock signal (CLK_CHK) that is different than the first clock signal (CLK). The first clock signal (CLK) may be referred to as a main clock signal or a primary clock signal, and the second clock signal (CLK_CHK) may be referred to as a clock check signal or a reference clock signal (REF_CLK).

The clock checker circuitry 100 may include first clock circuitry 102 that receives the first clock signal (CLK) and provides sampled offset pulses (A0[N-1:0], B0[N-1:0], C0[N-1:0], D0[N-1:0]) that are associated with the first clock signal (CLK) when enabled with enable signals (EN_A_CLK, EN_B_CLK). In various implementations, the first clock circuitry 102 may be referred to as main clock circuitry or primary clock circuitry. The first clock circuitry 102 may receive a first reset signal or a primary reset signal (RST), and the first clock circuitry 102 may provide the sampled offset pulses (A0[N-1:0], B0[N-1:0], C0[N-1:0], D0[N-1:0]) when enabled with the first or primary reset signal (RST). In some instances, N=3.

The clock checker circuitry 100 may also include second clock circuitry 106 that receives the second clock signal (CLK_CHK) and provides the enable signals (EN_A_CLK, EN_B_CLK) to the first clock circuitry (102) based on the second clock signal (REF_CLK). The second clock circuitry 106 may be referred to as reference clock circuitry. In addition, the second (or reference) clock signal (CLK_CHK or REF_CLK) may be mesochronous with the first (or primary) clock signal (CLK). Mesochronous may refer to clock signals having the same frequency with different phases. The second clock signal (CLK_CHK or REF_CLK) may have the same frequency as the first clock signal (CLK), and the second clock signal (CLK_CHK or REF_CLK) may have a different phase than the first clock signal (CLK). The second clock circuitry 106 may receive a second reset signal (RST_CHK), and the second clock circuitry 106 may provide the enable signals (EN_A_CLK, EN_B_CLK) when enabled with the second reset signal (RST_CHK).

The clock checker circuitry 100 may include the fault detector circuitry 120 that receives the sampled offset pulses (A0[N-1:0], B0[N-1:0], C0[N-1:0], D0[N-1:0]) from the first clock circuitry 102, receives the enable signals (EN_A_CLK, EN_B_CLK) from the second clock circuitry 106, and provides one or more error flags (Err_A, Err_B) for detected faults of the first clock signal (CLK) based on the sampled offset pulses (A0[N-1:0], B0[N-1:0], C0[N-1:0], D0[N-1:0]) from the first clock circuitry 102 and based on the enable signals (EN_A_CLK, EN_B_CLK) received from the second clock circuitry 106. In some implementations, the detected faults may include stuck-at faults, and the one or more error flags (Err_A, Err_B) may include a first error flag (Err_A) that refers to the stuck-at faults. In other implementations, the detected faults may include transient faults, and the one or more error flags (Err_A, Err_B) may include a second error flag (Err_B) that refers to the transient faults.

As shown in FIG. 1B, the clock checker circuitry 100 includes the clock generator circuitry 101 and also the fault detector circuitry 120. In some instances, the clock generator circuitry 101 may include a clock generator 104 that generates the first clock signal (CLK) as a main or primary clock signal (CLK) and generates the second clock signal (CLK_CHK) as a clock check signal (CLK_CHK) or as a reference clock signal (REF_CLK).

The first clock circuitry 102 may include first counter/sampler circuitry 103A and second counter/sampler circuitry 103B. For instance, as shown in FIG. 1B, the first clock circuitry 102 may include multiple counters 108A, 108B and multiple samplers 110A, 110B, 110C, 110D. Also, the first counter/sampler circuitry 103A may include a first counter 108A coupled to a first sampler 110A and a second sampler 100B, and the second counter/sampler circuitry 103B may include a third counter 110C and a fourth counter 100D. In this instance, the multiple counters 108A, 108B count clock edges of the first clock signal (CLK), and the multiple samplers 110A, 110B, 110C, 110D sample offset pulses (e.g., samples a binary number value of 1 as 3-bit sequence 001, and samples a binary number value of 7 as 3-bit sequence 111) in a M-value cyclical pulse sequence (e.g., $M=2^3=8$) of the first clock signal (CLK) and provide the sampled offset pulses (A0[N-1:0], B0[N-1:0], C0[N-1:0], D0[N-1:0]) to the fault detector circuitry 120 when enabled with the enable signals (EN_A_CLK, EN_B_CLK).

The first counter 108A may be implemented as a first N-bit counter that receives the first clock signal (CLK) and the first reset signal (RST), counts clock edges of the first clock signal (CLK), and provides a first count value (CV_A) of the first clock signal (CLK) to the first and second samplers 110A, 110B. The first sampler 110A receives the first count value (CV_A) of the first clock signal (CLK) from the first N-bit counter 108A, receives the first enable signal (EN_A_CLK) from the second clock circuitry 106, and provides a first sampled offset pulse (A0[N-1:0]) to the fault detector 120. The second sampler 110B receives the first count value (CV_A) of the first clock signal (CLK) from the first N-bit counter 108A, receives the second enable signal (EN_B_CLK) from the second clock circuitry 106, and also provides a third sampled offset pulse (C0[N-1:0]) to the fault detector 120. In some instances, N=3, and N-bit refers to 3-bit.

The second counter 108B may be implemented as a second N-bit counter that receives the first clock signal (CLK) and the first reset signal (RST), counts clock edges of the first clock signal (CLK), and provides a second count value (CV_B) of the first clock signal (CLK) to the third and fourth samplers 110C, 110D. The third sampler 110C receives the second count value (CV_B) of the first clock signal (CLK) from the second N-bit counter 108B, receives the first enable signal (EN_A_CLK) from the second clock circuitry 106, and provides a second sampled offset pulse (B0[N-1:0]) to the fault detector 120. The fourth sampler 110D receives the second count value (CV_B) of the first clock signal (CLK) from the second N-bit counter 108B, receives the second enable signal (EN_B_CLK) from the second clock circuitry 106, and also provides a fourth sampled offset pulse (D0[N-1:0]) to the fault detector 120.

The second clock circuitry 106 may include a reference counter 108C (or third counter), enable logic circuitry 112A, 112B, and logic gates 114A, 114B that are arranged to count clock edges of the second clock signal (REF_CLK), generate the enable signals (EN_A_CLK, EN_B_CLK) based on particular values of the counted clock edges of the second clock signal (REF_CLK), and provide the enable signals (EN_A_CLK, EN_B_CLK) to the first clock circuitry (102) and the fault detector 120. The enable logic circuitry 112A, 112B may include a first enable logic 112A and second enable logic 112B, and the logic gates 114A, 114B may include a first logic gate 114A and a second logic gate 114B. In some implementations, the logic gates 114A, 114B may be AND gates.

The reference (or third) counter 108C may be implemented as a third N-bit counter that receives the second clock signal (CLK_CHK) and the second reset signal (RST_CHK), counts clock edges of the second clock signal (CLK_CHK), and provides a third count value (CV_C) of the second clock signal (CLK_CHK) to the first enable logic 112A and the second enable logic 112B. The first enable logic 112A may receive the third count value (CV_C) and provide a first intermediate enable signal (EN_A) to the first logic gate 114A, and the second enable logic 112B may also receive the third count value (CV_C) and provide a second intermediate enable signal (EN_B) to the second logic gate 114B. The first logic gate 114A may receive the second clock signal (CLK_CHK) and the first intermediate enable signal (EN_A) and provide the first enable signal (ENA_CLK) to the first sampler 110A, the third sampler 110C and the fault detector 120. Also, the second logic gate 114B may receive the second clock signal (CLK_CHK) and the second intermediate enable signal (EN_B) and provide the second enable signal (EN_B_CLK) to the second sampler 110B, the fourth sampler 110D and the fault detector 120.

The fault detector 120 may monitor a value difference between the counted clock edges from the multiple counters 108A, 108B to detect faults on the first clock signal (CLK), and provide the error flags (Err_A, Err_B) for detected faults based on the sampled offset pulses (A0[N-1:0], B0[N-1:0], C0[N-1:0], D0[N-1:0]) from the first clock circuitry (102) and based on the enable signals from the second clock circuitry 106. The detected faults may include stuck-at faults and transient faults, wherein the first error flag (Err_A) may refer to stuck-at faults, and the second error flag (Err_B) may refer to transient faults.

As shown in FIG. 1C, the clock checker circuitry 100 includes the clock generator circuitry 101 and the fault detector circuitry 120. Also, as shown, the clock generator circuitry 101 may include the clock generator 104 as a first clock generator or primary clock generator that generates the first clock signal (CLK) as a primary clock signal (CLK). Further, the clock generator circuitry 101 may include another clock generator 105 as a second clock generator or reference clock generator that generates the second clock signal (CLK_CHK or REF_CLK) as a clock check signal (CLK_CHK) or as a reference clock signal (REF_CLK).

Figure 2:
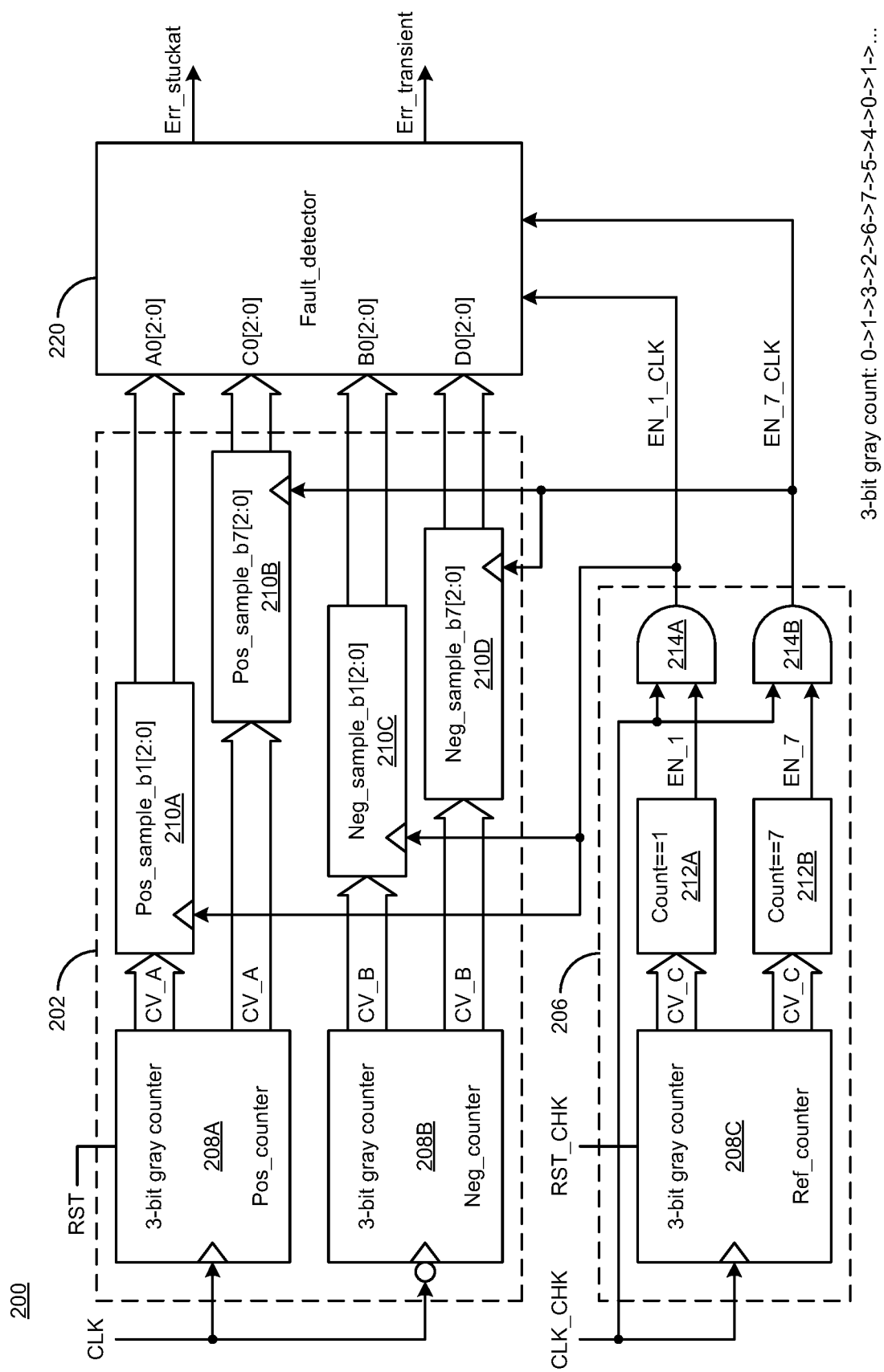
FIG. 2 illustrates another diagram of clock checker circuitry having fault detection in accordance with implementations described herein.

FIG. 2 illustrates a diagram of clock checker circuitry 200 having fault detection in accordance with various implementations described herein. The clock checker circuitry

200 in FIG. 2 has similar components and features as described in reference to the clock checker circuitry 100 of FIGS. 1A-1C.

As shown in FIG. 2, the clock checker circuitry 200 may include primary clock circuitry 202 that receives a primary clock signal (CLK), uses multiple counters 208A, 208B to count clock edges of the primary clock signal (CLK), uses multiple samplers 210A, 210B, 210C, 210D to sample offset pulses (e.g., may only sample a value of 1 as bit sequence 001 and a value of 7 as bit sequence 111) in a cyclical pulse sequence of the primary clock signal (CLK), and provides sampled offset pulses (A0[2:0], B0[2:0], C0[2:0], D0[2:0]) when enabled with enable signals (EN_1_CLK, EN_7_CLK). In some instances, the clock checker circuitry 200 may include a primary clock generator (e.g., 101, 104) that generates the primary clock signal (CLK) and the reference clock signal (CLK_CHK or REF_CLK) that is different than the primary clock signal (CLK). Otherwise, in other instances, the clock checker circuitry 200 may include a reference clock generator (e.g., 105) that is separate from the primary clock generator (101, 104), wherein the primary clock generator (101, 104) generates the primary clock signal (CLK), and the reference clock generator (105) generates the reference clock signal (CLK_CHK or REF_CLK) that is different than the primary clock signal (CLK).

The multiple counters 208A, 208B of the primary clock circuitry 202 may include a first N-bit gray counter 208A and a second N-bit gray counter 208B. Also, the cyclical pulse sequence of the primary clock signal (CLK) may have an M-value cyclical pulse sequence that is gray-coded with a gray count by the multiple counters 208A, 208B. In some instances, $M=2^N$, e.g., N=3 and $M=2^3$, wherein M=8, and M-value refers to an 8-value. Also, the offset pulses may refer to a gray count pulse sequence having a first N-bit pulse sequence (e.g., N=3, and the 3-bit has a first binary value of 001) and a second 3-bit pulse sequence (e.g., N=3, and the 3-bit has a second binary value of 111). In some implementations, the N-bit gray counters 208A, 208B may include 3-bit gray counters that utilize a 3-bit gray count having a particular gray-coded sequence, such as, e.g., 0→1→3→2→6→7→5→4→0→1→etc.

The first N-bit gray counter 208A may sense a positive clock edge of the first 3-bit pulse sequence, sense a positive clock edge of the second 3-bit pulse sequence, count each positive clock edge of the first 3-bit pulse sequence in each repeating 8-value cyclical pulse sequence, and count each positive clock edge of the second 3-bit pulse sequence in each repeating 8-value cyclical pulse sequence. In some instances, the first N-bit gray counter 208A may include a 3-bit gray positive-edge counter (Pos_counter) that provides a first count value (CV_A) to a first sampler 210A and a second sampler 210B.

The multiple samplers may include the first sampler 210A coupled to the first N-bit gray counter 208A that samples a positive edge of the first 3-bit pulse sequence (001) of the offset pulses in the 8-value cyclical pulse sequence of the primary clock signal (CLK). The first sampler 210A (Pos_sample_b1[2:0]) may provide a first 3-bit sampled offset pulse (001 as A0[2:0]) of the sampled offset pulses to the fault detector circuitry 220 when enabled with a first enable signal (EN_1_CLK) of the enable signals. The multiple samplers may also include the second sampler 210B (Pos_sample_b7[2:0]) coupled to the first N-bit gray counter 208A that samples a positive edge of the second 3-bit pulse sequence (111) of the offset pulses in the 8-value cyclical pulse sequence of the primary clock signal (CLK). The second sampler 210B may provide a second 3-bit sampled offset pulse (111 as C0[2:0]) of sampled offset pulses to the fault detector circuitry 220 when enabled with a second enable signal (EN_7_CLK) of the enable signals.

The second N-bit counter 208B may sense a negative clock edge of the first 3-bit pulse sequence, sense a negative clock edge of the second 3-bit pulse sequence, count each negative clock edge of the first 3-bit pulse sequence in each repeating 8-value cyclical pulse sequence, and count each negative clock edge of the second 3-bit pulse sequence in each repeating 8-value cyclical pulse sequence. In some instances, the second N-bit gray counter 208B may include a 3-bit gray negative-edge counter (Neg_counter) that provides a second count value (CV_B) to a third sampler 210C and a fourth sampler 21 OD.

The multiple samplers may include the third sampler 210C coupled to the second N-bit gray counter 208B that samples a negative edge of the first 3-bit pulse sequence (001) of the offset pulses in the 8-value cyclical pulse sequence of the primary clock signal (CLK). The third sampler 210C (Neg_sample_b1[2:0]) may provide a third-binary sampled offset pulse (001 as B0[2:0]) of the sampled offset pulses to the fault detector circuitry 220 when enabled with the first enable signal (EN_1_CLK) of the enable signals. The multiple samplers may also include the fourth sampler 210D (Neg_sample_b7[2:0]) coupled to the second N-bit gray counter 208D that samples a negative edge of the second 3-bit pulse sequence (111) of the offset pulses in the 8-value cyclical pulse sequence of the primary clock signal (CLK). The fourth sampler 210D may provide a second 3-bit sampled offset pulse (111 as D0[2:0]) of sampled offset pulses to the fault detector circuitry 220 when enabled with the second enable signal (EN_7_CLK) of the enable signals.

The clock checker circuitry 200 may also include reference clock circuitry 206 that receives a reference clock signal (CLK_CHK or REF_CLK), uses a reference counter 208C to count clock edges of the reference clock signal (CLK_CHK or REF_CLK), generates the enable signals (EN_A_CLK, EN_B_CLK) based on particular values of counted clock edges of the reference clock signal (CLK_CHK or REF_CLK), and provides the enable signals (EN_A_CLK, EN_B_CLK) to the primary clock circuitry 202. The reference counter 208C may include a third N-bit gray counter. The reference clock signal (CLK_CHK or REF_CLK) may have an 8-value cyclical pulse sequence that may be gray-coded with a gray count by the reference counter 208C. The particular values of the counted clock edges may refer to offset pulses of another gray count pulse sequence having the first 3-bit pulse sequence (001) and the second 3-bit pulse sequence (111). In some instances, the third N-bit gray counter 208A may include a 3-bit gray counter (Ref_counter) that provides a third count value (CV_C) to first enable logic 212A and a second enable logic 212B.

The third N-bit gray counter 208C (Ref_counter) may sense a positive clock edge of the first 3-bit pulse sequence (001), sense a positive clock edge of the second 3-bit pulse sequence (111), count each positive clock edge of the first 3-bit pulse sequence (001) in each repeating 8-value cyclical pulse sequence, and count each positive clock edge of the second 3-bit pulse sequence (111) in each repeating 8-value cyclical pulse sequence.

The reference clock circuitry 206 may include first logic circuitry 212A, 214A that provides the first enable signal (EN_1_CLK) of the enable signals (EN_1_CLK, EN_7_CLK) to the primary clock circuitry 202 and the fault detector circuitry 220 for each positive clock edge of the first 3-bit pulse sequence (001). The first logic circuitry 212A, 214A may include the first enable logic 212A that receives the third count value (CV_C) when the count==1 and provides a first intermediate enable signal (EN_1) to a first logic gate 214A. Also, the first logic gate 214A may receive the reference clock signal (CLK_CHK or REF_CLK), receive the first intermediate enable signal (EN_1) from the first enable logic 212A, and provide the first enable signal (EN_1_CLK) to the first sampler 210A, the third sampler 210C, and the fault detector circuitry 220. The logic gates 214A, 214B may be AND gates.

The reference clock circuitry 206 may include second logic circuitry 212B, 214B that provides a second enable signal (EN_7_CLK) of the enable signals (EN_1_CLK, EN_7_CLK) to the primary clock circuitry 202 and the fault detector circuitry 220 for each positive clock edge of the second 3-bit pulse sequence (111). The second logic circuitry 212A, 214A may include the second enable logic 212B that receives the third count value (CV_C) when the count==7 and provides a second intermediate enable signal (EN_7) to a second logic gate 214B. Also, the second logic gate 214B may receive the reference clock signal (CLK_CHK or REF_CLK), receive the second intermediate enable signal (EN_7) from the second enable logic 212B, and provide the second enable signal (EN_7_CLK) to the second sampler 210B, the fourth sampler 210D, and the fault detector circuitry 220.

The clock checker circuitry 200 may also include fault detector circuitry 220 that receives the sampled offset pulses (A0[2:0], B0[2:0], C0[2:0], D0[2:0]) from the primary clock circuitry 202, receives the enable signals (EN_A_CLK, EN_B_CLK) from the reference clock circuitry 206, monitors a value difference between counted clock edges from the multiple counters 208A, 208B to detect faults on the primary clock signal (CLK), and provides one or more error flags (Err_stuckat, Err_transient) for detected faults on the primary clock signal (CLK) based on the sampled offset pulses (A0[2:0], B0[2:0], C0[2:0], D0[2:0]) from the primary clock circuitry 202 and based on the enable signals (EN_A_CLK, EN_B_CLK) from the reference clock circuitry 206.

In some implementations, the fault detector circuitry 220 may monitor the value difference between the counted clock edges from the multiple counters 208A, 208B to detect faults on the primary clock signal (CLK). The fault detector circuitry 220 may achieve fault detection by storing previous values of the counted clock edges from the multiple counters 208A, 208B, by storing current values of the counted clock edges from the multiple counters 208A, 208B, and by comparing the previous values to the current values so as to determine the value difference between the counted clock edges from the multiple counters 208A, 208B to detect the faults on the primary clock signal (CLK).

In various implementations, the reference clock signal (CLK_CHK or REF_CLK) is mesochronous with the primary clock signal (CLK), wherein as mentioned above, mesochronous refers to clock signals having the same frequency with different phases. As such, the reference clock signal (CLK_CHK or REF_CLK) may have the same frequency as the primary clock signal (CLK), and the reference clock signal (CLK_CHK or REF_CLK) may have a different phase than the primary clock signal (CLK). In some implementations, the detected faults may include stuck-at faults, and the one or more error flags (Err_A, Err_B) may include a first error flag (Err_A) that refers to the stuck-at faults. Also, the detected faults may include transient faults, and the one or more error flags (Err_A, Err_B) may include a second error flag (Err_B) that refers to the transient faults.

In some implementations, the primary clock (CLK) domain has two 3-bit wide gray-code counters 208A, 208B running on opposite edges of the primary clock (CLK). The gray-code counters 208A, 208B are shown as the Pos_counter 208A and the Neg_counter 208B in FIG. 2, and these counters 208A, 208B are counting all 8 states of the gray code before starting again in cyclical sequence. These counters 208A, 208B may use a primary reset (RST) to reset counter values to 3-bit 0 (i.e., 000). There is a reference counter 208C (Ref_counter) that is also gray-coded with 8 states which is running off positive edge of the reference clock (CLK_CHK). The reference counter 208C may use a shadow reset (RST_CHK) to reset counter values to 3-bit 0 (i.e., 000). Note that there is no definite relationship required between RST and RST_CHK. As such, whenever Ref_counter reaches a value of 1 or 7, a sampling pulse may be generated to sample both the Pos_counter value 208A and the Neg_counter value 208B for sending the counter values to the fault_detector block 220. The fault detector block 220 stores previous values of the Pos_counter 208A and the Neg_counter 208B, and current values of the Pos_counter 208A and the Neg_counter 208B. Also, the fault_detector 220 monitors the value difference between the two counters 208A, 208B and detects stuck-at and transient faults on the primary clock (CLK).

Figure 3A:
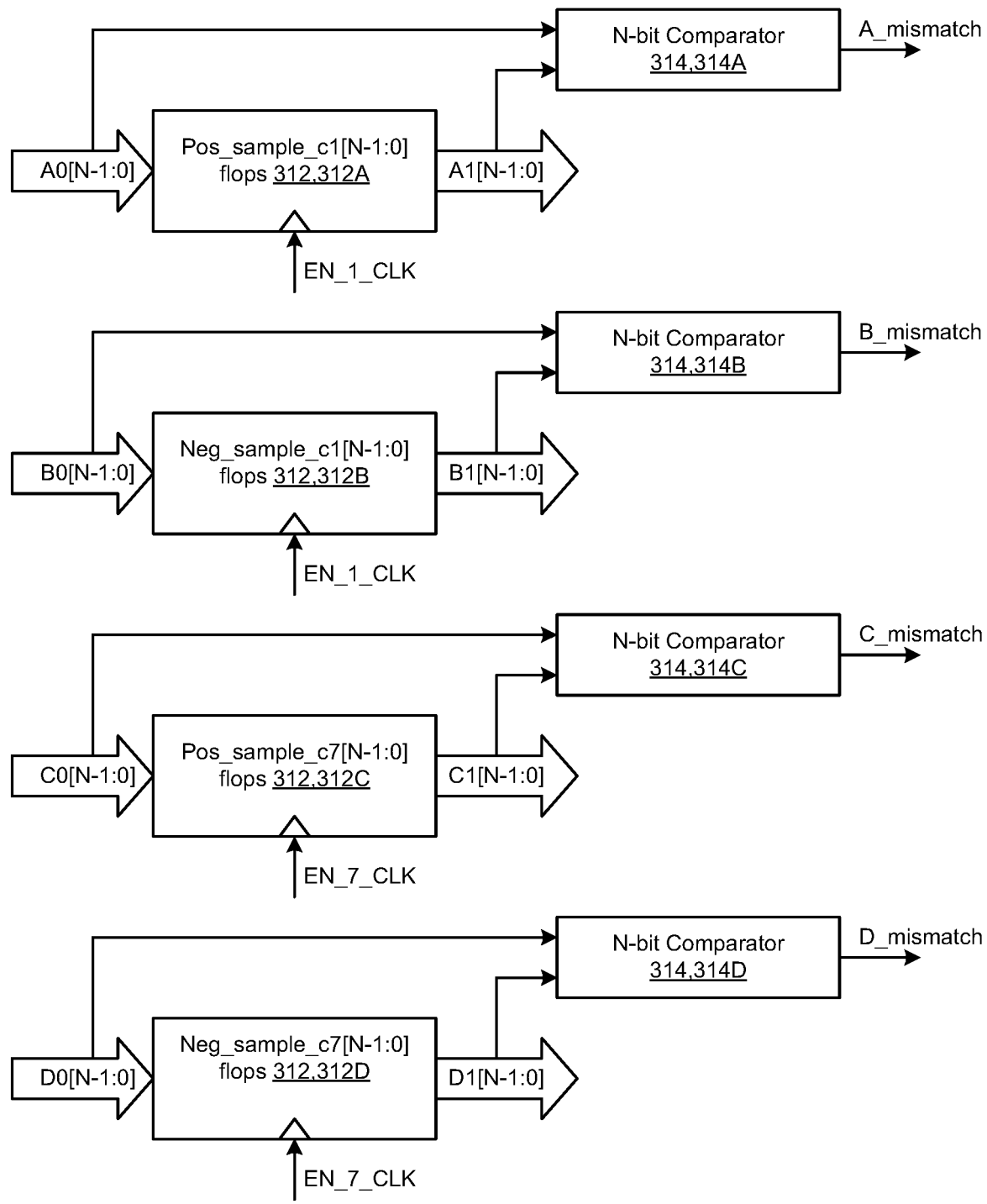
FIGS. 3A-3C illustrate various diagrams of fault detector circuitry in accordance with implementations described herein.
Figure 3B:
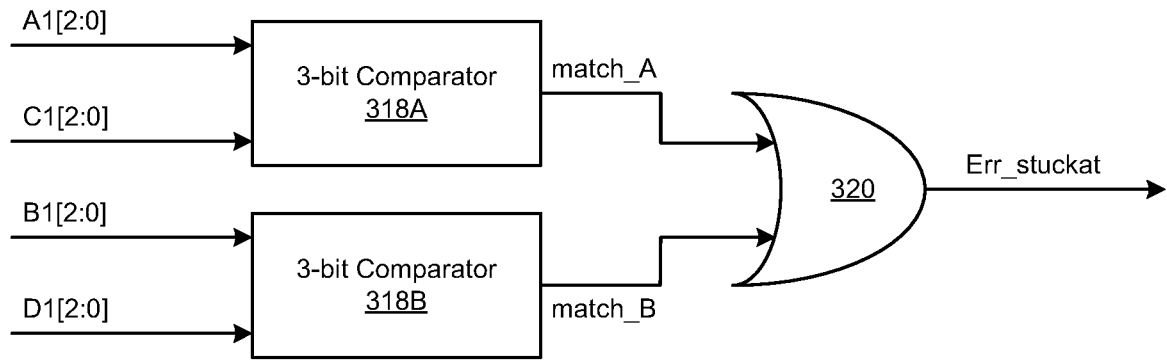
Figure 3C:
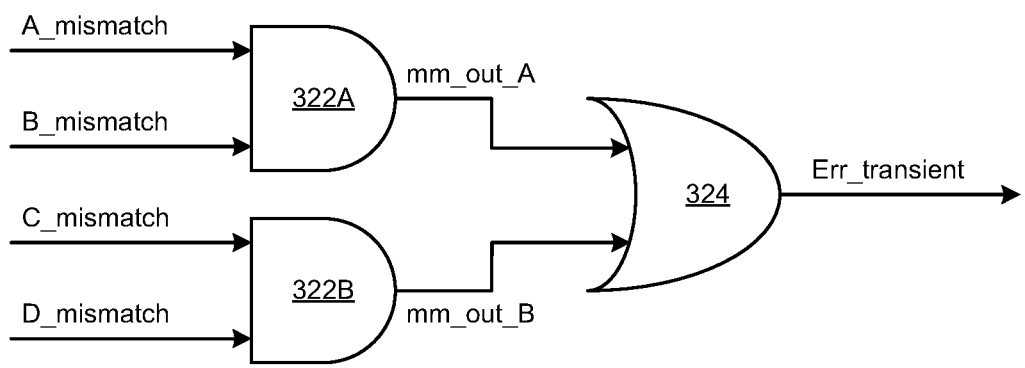

FIGS. 3A-3C illustrate diagrams of fault detector circuitry 300 in accordance with various implementations described herein. In particular, FIG. 3A shows a diagram 300A of the fault detector circuitry 300 having register circuitry 312 and comparator circuitry 314, FIG. 3B shows a diagram 300B of fault detector circuitry 300 having first fault detector logic 302 for detecting stuck-at faults, and FIG. 3C shows a diagram 300C of fault detector circuitry 300 having second fault detector logic 304 for detecting transient faults.

As shown in FIG. 3A, the fault detector circuitry 300 may include the register circuitry 312 and the comparator circuitry 314. The register circuitry 312 includes multiple N-bit registers including, e.g., a first N-bit register 314A, a second N-bit register 314B, a third N-bit register 314C and a fourth N-bit register 314D. The comparator circuitry 314 includes multiple N-bit comparators 314 including, e.g., a first N-bit comparator 314A, a second N-bit comparator 314B, a third N-bit comparator 314C and a fourth N-bit comparator 314D.

The first N-bit register 312A includes flop circuitry (Pos_sample_c1[N-1:0] flops) that is arranged to store a data value associated with the sampled offset pulse (A0[N-1:0]). The first N-bit register 312A may be coupled to the first N-bit comparator 314A, wherein the first N-bit register 312A may be implemented as a first 3-bit register, and the first N-bit comparator 314A may be implemented as a first 3-bit comparator. In some instances, the first N-bit register 314A may receive the sampled offset pulse (A0[N-1:0]), store a value of the sampled offset pulse (A0[N-1:0]), and provide two successive sample values (A1[N-1:0]) when enabled by the first enable signal (EN_1_CLK). Also, in this instance, the first N-bit comparator 314A may receive the sampled offset pulse (A0[N-1:0]), receive the two successive sample values (A1[N-1:0]), compare the two successive sample values (A1[N-1:0]) to the sampled offset pulse (A0[N-1:0]), and provide a first mismatch signal (A_mismatch) when there is a mismatch between the compared values (A0[N-1:0], A1[N-1:0]). In some instances, N=3.

The second N-bit register 312B includes flop circuitry (Neg_sample_c1[N-1:0] flops) that is arranged to store a data value associated with the sampled offset pulse (B0[N-1:0]). The second N-bit register 312B may be coupled to the second N-bit comparator 314B, wherein the second N-bit register 312B may be implemented as a second 3-bit register, and the second N-bit comparator 314B may be implemented as a second 3-bit comparator. In some instances, the second N-bit register 314B may receive the sampled offset pulse (B0[N-1:0]), store a value of the sampled offset pulse (B0[N-1:0]), and provide two successive sample values (B1[N-1:0]) when enabled by the first enable signal (EN_1_CLK). Also, in this instance, the second N-bit comparator 314B may receive the sampled offset pulse (B0[N-1:0]), receive the two successive sample values (B1[N-1:0]), compare the two successive sample values (B1[N-1:0]) to the sampled offset pulse (B0[N-1:0]), and provide a second mismatch signal (B_mismatch) when there is a mismatch between the compared values (B0[N-1:0], B1[N-1:0]).

The third N-bit register 312C includes flop circuitry (Pos_sample_c7[N-1:0] flops) that is arranged to store a data value associated with the sampled offset pulse (C0[N-1:0]). The third N-bit register 312C may be coupled to the third N-bit comparator 314C, wherein the third N-bit register 312C may be implemented as a third 3-bit register, and the third N-bit comparator 314C may be implemented as a third 3-bit comparator. In some instances, the third N-bit register 314C may receive the sampled offset pulse (C0[N-1:0]), store a value of the sampled offset pulse (C0[N-1:0]), and provide two successive sample values (C1[N-1:0]) when enabled by the second enable signal (EN_7_CLK). Also, in this instance, the third N-bit comparator 314C may receive the sampled offset pulse (C0[N-1:0]), receive the two successive sample values (C1[N-1:0]), compare the two successive sample values (C1[N-1:0]) to the sampled offset pulse (C0[N-1:0]), and provide a third mismatch signal (C_mismatch) when there is a mismatch between the compared values (C0[N-1:0], C1[N-1:0]).

The fourth N-bit register 312D includes flop circuitry (Neg_sample_c7[N-1:0] flops) that is arranged to store a data value associated with the sampled offset pulse (D0[N-1:0]). The fourth N-bit register 312D may be coupled to the fourth N-bit comparator 314D, wherein the fourth N-bit register 312D may be implemented as a fourth 3-bit register, and the fourth N-bit comparator 314D may be implemented as a fourth 3-bit comparator. In some instances, the fourth N-bit register 314D may receive the sampled offset pulse (D0[N-1:0]), store a value of the sampled offset pulse (D0[N-1:0]), and provide two successive sample values (D1[N-1:0]) when enabled by the second enable signal (EN_7_CLK). Also, in this instance, the fourth N-bit comparator 314D may receive the sampled offset pulse (D0[N-1:0]), receive the two successive sample values (D1[N-1:0]), compare the two successive sample values (D1[N-1:0]) to the sampled offset pulse (D0[N-1:0]), and provide a fourth mismatch signal (D_mismatch) when there is a mismatch between the compared values (D0[N-1:0], D1[N-1:0]).

FIG. 3A shows the fault detector circuitry 300 as having a set of multiple N-bit registers 312 (e.g., a set of four 3-bit registers) that store sampled values as follows:
  use Pos_Counter 312A when Ref_counter value is 1 (e.g., Count==1), which is shown as Pos_sample_c1[N-1:0] with A0/A1 as values between two successive samples,
  use Neg_Counter 312B when Ref_counter value is 1 (e.g., Count==1), which is shown as Neg_sample_c1[N-1:0] with B0/B1 as values between two successive samples,
  use Pos_Counter 312C when Ref_counter value is 7 (e.g., Count==7), which is shown as Pos_sample_c7[N-1:0] with C0/C1 as values between two successive samples, and
  use Neg_Counter 312D when Ref_counter value is 7 (e.g., Count==7), which is shown as Neg_sample_c7[N-1:0] with D0/D1 as values between two successive samples.

FIG. 3B shows the fault detector circuitry 300 with the first fault detector logic 302 for detecting stuck-at faults. As shown, the first fault detector logic 302 may include a first N-bit comparator 318A, a second N-bit comparator 318B and a logic gate 320. The first N-bit comparator 318A may be implemented as a 3-bit comparator that receives and compares multiple sample values (A1[2:0], C1[2:0]), determines whether there is a match, and provides a first match signal (match_A) to the logic gate 320. The second N-bit comparator 318B may be implemented as another 3-bit comparator that receives and compares multiple sample values (B1[2:0], D1[2:0]), determines whether there is a match, and provides a second match signal (match_B) to the logic gate 320. Also, the logic gate 320 receives the first match signal (match_A), receives the second match signal (match_B), and provides the first error signal (Err_A or Err_stuckat). The logic gate 320 may be a NOR gate.

FIG. 3C shows the fault detector circuitry 300 with the second fault detector logic 304 for detecting transient faults. As shown, the second fault detector logic 304 may include a first logic gate 322A, a second logic gate 322B and a third logic gate 324. The first logic gate 322A may be implemented as an AND gate that receives multiple mismatch signals (A_mismatch, B_mismatch) and provides a first mismatch output signal (mm_out_A) to the third logic gate 324. The second logic gate 322B may be implemented as an AND gate that receives multiple mismatch signals (C_mismatch, D_mismatch) and provides a second mismatch output signal (mm_out_B) to the third logic gate 324. Also, the third logic gate 324 receives the first mismatch output signal (mm_out_A), receives the second mismatch output signal (mm_out_B), and provides the second error signal (Err_B or Err_transient). The third logic gate 324 may be a NOR gate.

Figure 4A:
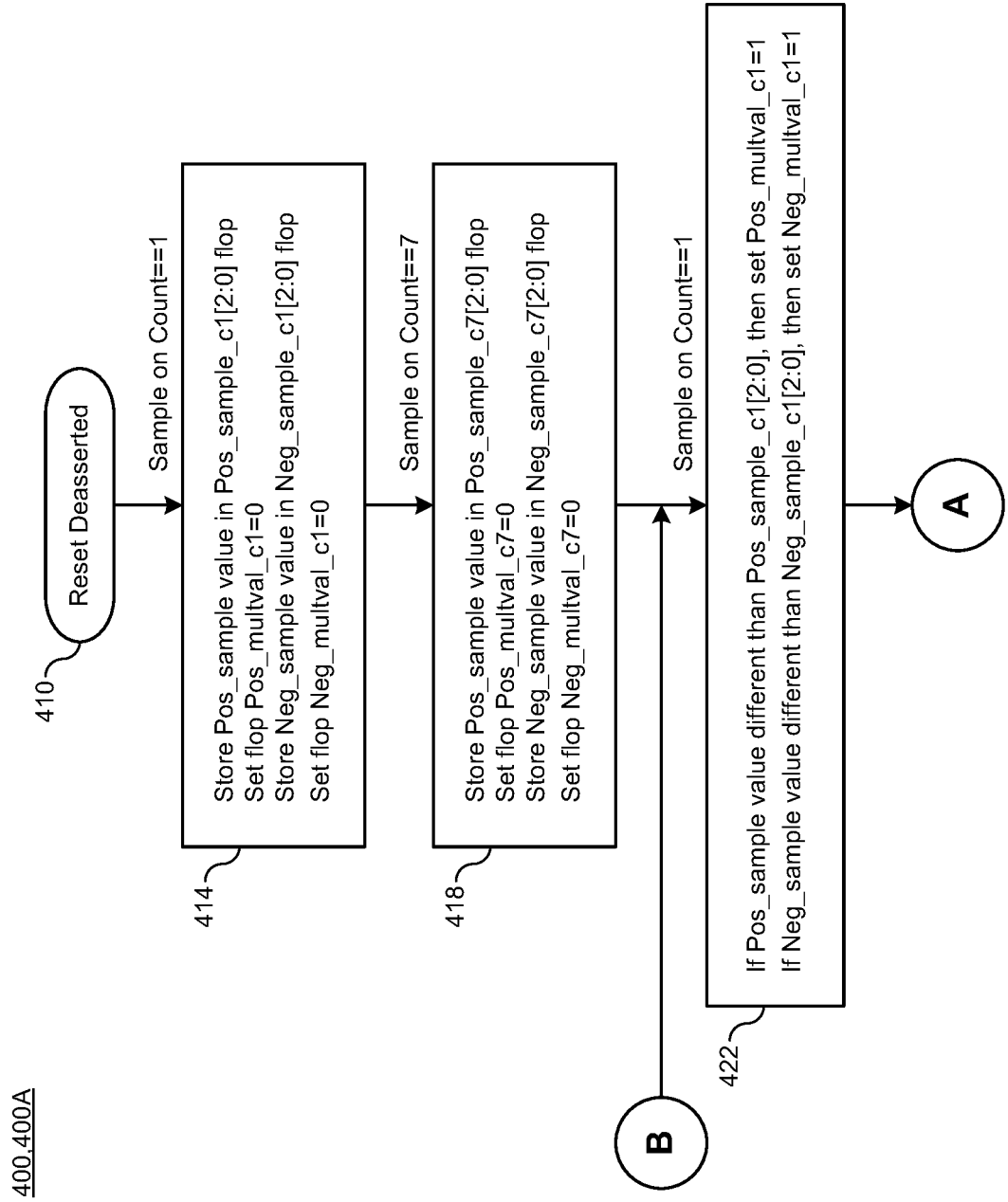
FIGS. 4A-4B illustrate a process flow diagram of a method for fault detection in accordance with implementations described herein.
Figure 4B:
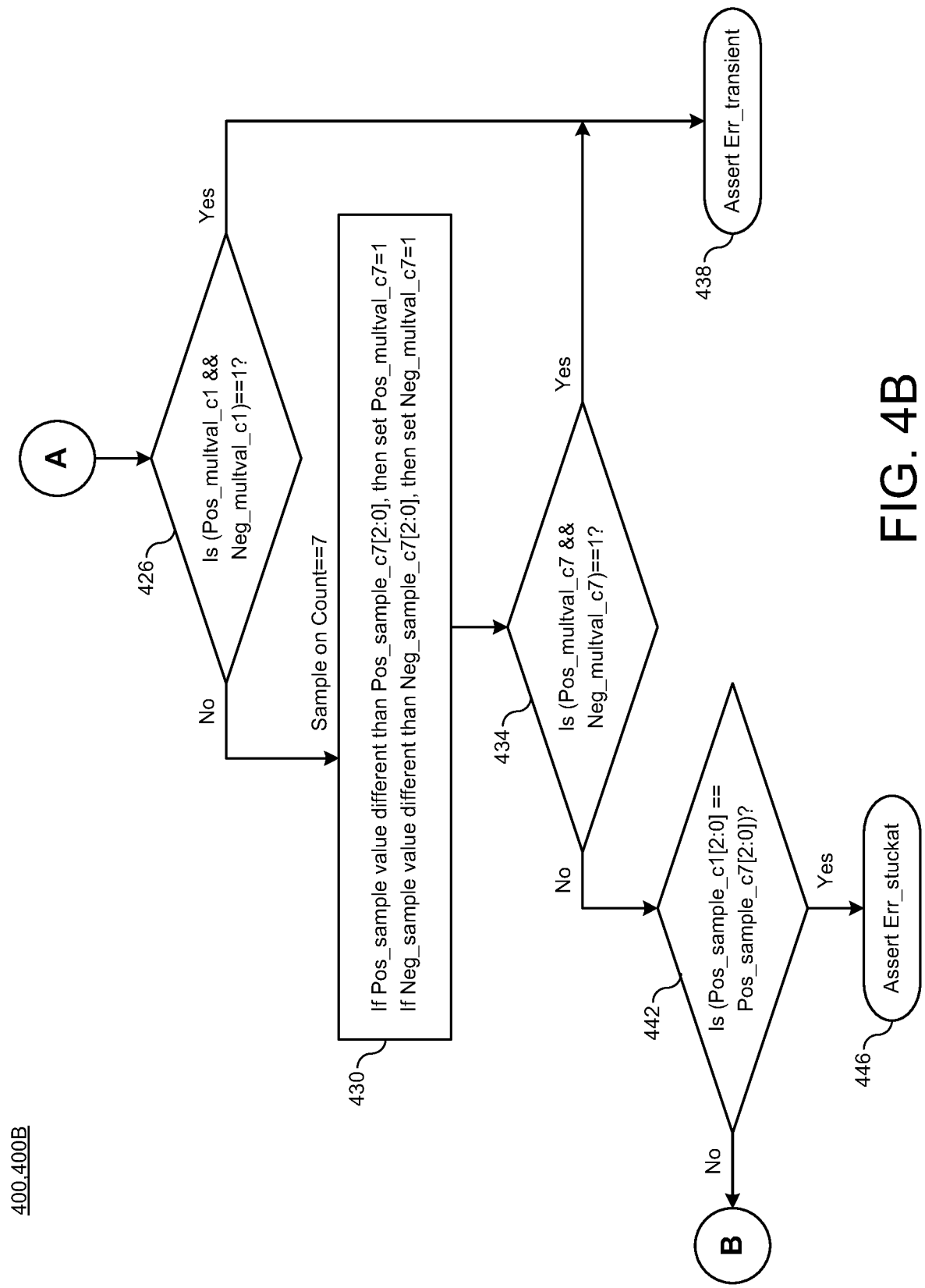

FIGS. 4A-4B illustrate a process flow diagram of a method 400 for fault detection in accordance with various implementations described herein. In particular, FIG. 4A refers to a first part 400A of the method 400, and FIG. 4B refers to a second part 400B of the method 400. The parts 400A, 400B are coupled via encircled elements A, B.

In block 410, method 400 may de-assert reset.
In block 414, to sample on Count==1, method 400 may perform the following:
  store Pos_sample value in Pos_sample_c1[2:0] flop,
  set flop Pos_multval_c1=0,
  store Neg_sample value in Neg_sample_c1[2:0] flop, and
  set flop Neg_multval_c1=0.
In block 418, to sample on Count==7, method 400 may perform the following:
  store Pos_sample value in Pos_sample_c7[2:0] flop,
  set flop Pos_multval_c7=0,
  store Neg_sample value in Neg_sample_c7[2:0] flop, and
  set flop Neg_multval_c7=0.
In block 422, to sample on count==1, method 400 may perform the following:
  if Pos_sample value different than Pos_sample_c1[2:0], then set Pos_multval_c1=1, and
  if Neg_sample value different than Neg_sample_c1[2:0], then set Neg_multval_c1=1.
In decision block 426, method 400 may perform the following:
  determine if (Pos_multval_c1 && Neg_multval_c1)==1, and
    if yes, then assert Err_transient in block 438, or
    if no, then advance to block 430.
In block 430, to sample on count==7, method 400 may perform the following:

if Pos_sample value different than Pos_sample_c7[2:0], then set Pos_multval_c7=1, and
if Neg_sample value different than Neg_sample_c7[2:0], then set Neg_multval_c7=1.

In decision block 434, method 400 may perform the following:
determine if (Pos_multval_c7 && Neg_multval_c7)==1, and
if yes, then assert Err_transient in block 438, or
if no, then advance to decision block 442.

In decision block 442, method 400 may perform the following:
determine if (Pos_sample_c1[2:0]==Pos_sample_c7[2:0]), and
if yes, then assert Err_stuckat in block 446, or
if no, then return to block 422.

In reference to FIGS. 4A-4B, method 400 may involve the following technique to detect stuck-at errors and transient errors using fault detection. For instance, one idea refers to a case where the reference counter is 1 during sampling of the Pos_counter. This instance may result in meta-stability, since CLK_CHK has an unknown phase with respect to the CLK, which leads to A0/A1 values being different. However, B0/B1 values must not be different when A0/A1 are different, since B0/B1 values are sampled at negative-edge of the CLK, and the meta-stability window (e.g., window between setup and hold time) cannot be half-cycle wide. If both A0/A1 and B0/B1 are different values, it is due to a transient fault on the CLK, which may be an extra edge or a missing edge on the CLK. If A1/C1 are the same and B1/D1 are the same over time, then the primary counters have the same value across multiple clock edges of the reference clock (CLK_CHK), which is an indication of a stuck-at fault. Table 1 provided herein below provides various other cases for detecting faults.

TABLE 1

State table for various scenarios

| No. | Case | Type of Fault | Comment |
|---|---|---|---|
| 1 | A0 == A1 and B0 == B1 | None | No meta-stability on any edge and no faults |
| 2 | A0! = A1 and B0 == B1 | None | Meta-stability on pos-edge and no faults |
| 3 | A0 == A1 and B0! = B1 | None | Meta-stability on neg-edge and no faults |
| 4 | A0! = A1 and B0! = B1 | Transient Fault | Missing edge or extra edge on CLK |
| 5 | A0 == A1 == C0 == C1 | Stuck-At Fault | Stuck-high or stuck-low faults |

Figure 5A:
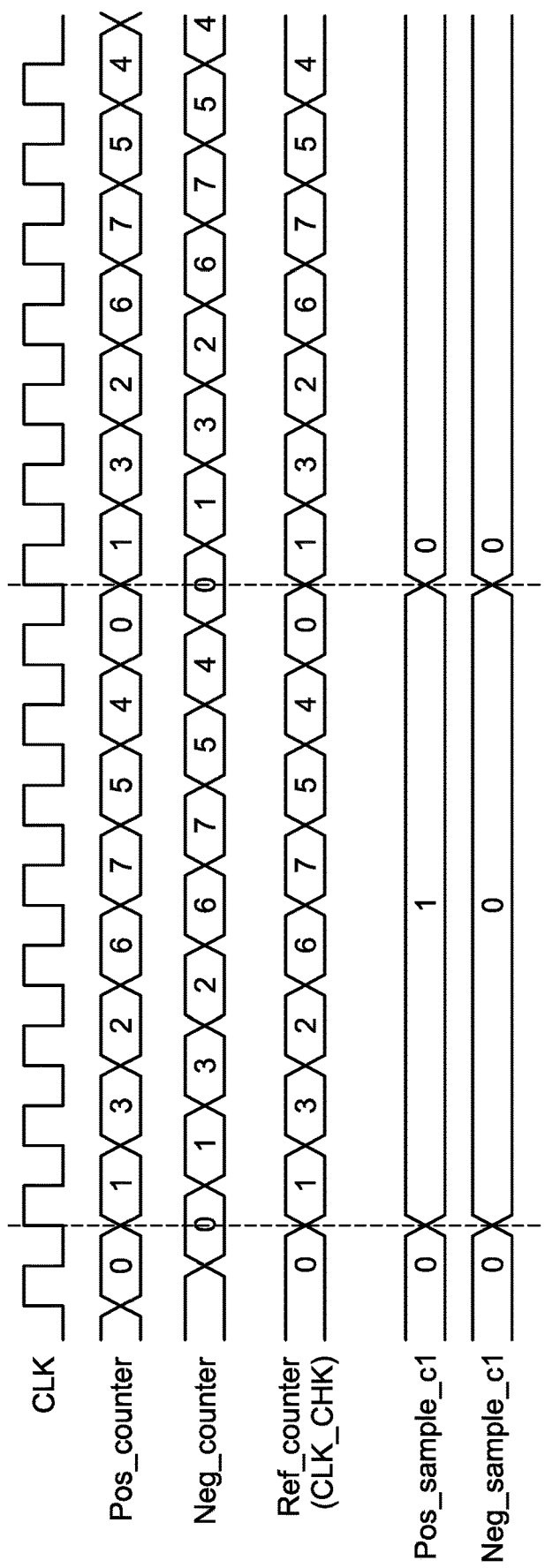
FIGS. 5A-5D illustrate various waveform diagrams associated with fault detection in accordance with implementations described herein.
Figure 5B:
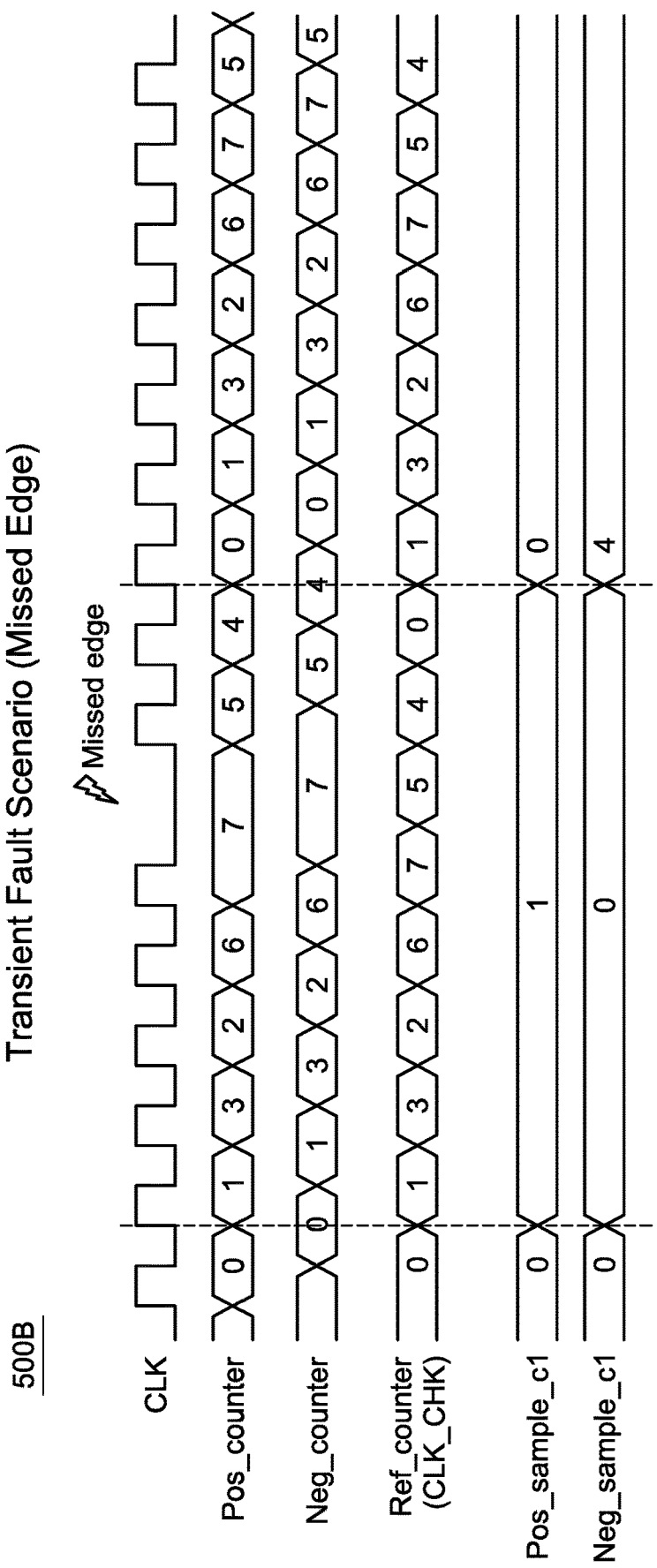
Figure 5C:
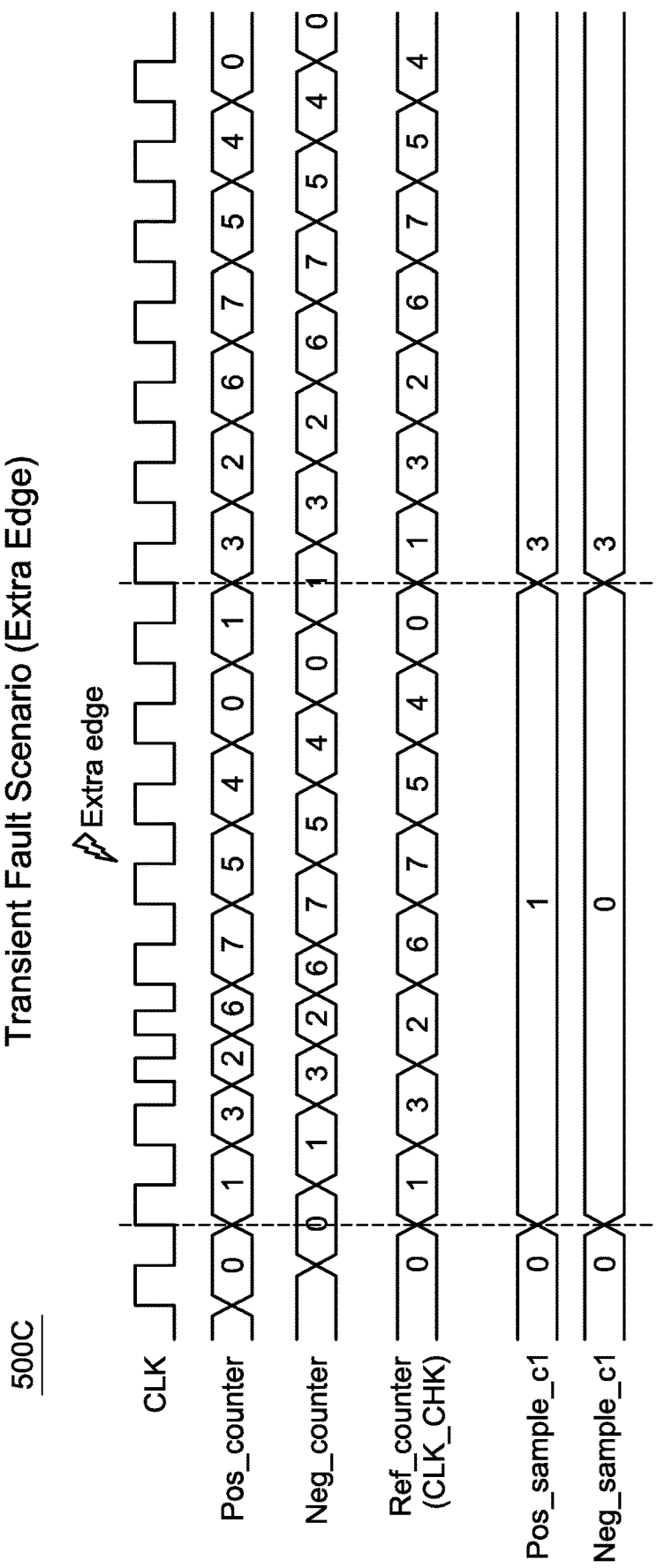
Figure 5D:
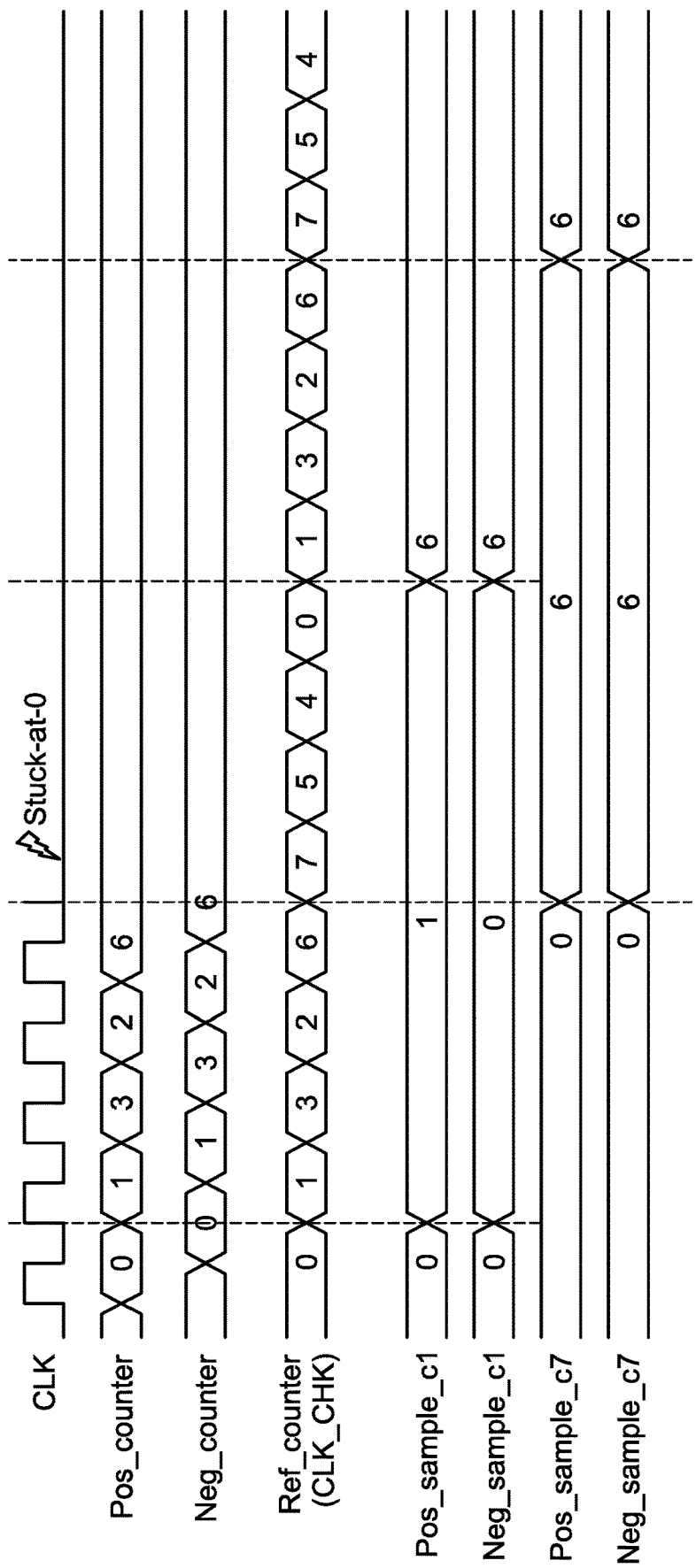

FIGS. 5A-5D illustrate various waveform diagrams associated with fault detection in accordance with various implementations described herein. In particular, FIG. 5A shows a waveform diagram 500A associated with a no fault scenario, FIG. 5B shows a waveform diagram 500B associated with a transient fault scenario (missing edge), FIG. 5C shows a waveform diagram 500C associated with another transient fault scenario (extra edge), and FIG. 5D shows a waveform diagram 500D associated with a stuck-at fault scenario.

As shown in FIG. 5A, the waveform diagram 500A shows a first case (1) that is associated with a no fault scenario. In this instance, the waveform diagram 500A provides for no fault with meta-stability on the pos-edge of the CLK, wherein FIG. 5A shows a clock diagram when there are no faults on the CLK. As shown, the CLK_CHK positive edge has meta-stability with respect to the positive edge of the CLK, and thus, Pos_sample_c1 values are different across sampling. However, at the same time, the positive edge of the CLK_CHK will not have meta-stability with the neg-edge of the CLK, which may result in the same values on the Neg_sample_c1 across different sampling points.

As shown in FIG. 5B, the waveform diagram 500B shows a second case (2) that is associated with a transient fault scenario having a missing edge. In this instance, the waveform diagram 500B provides for a transient fault on the CLK with respect to a missed edge, wherein as shown in FIG. 5B, a transient fault on the CLK will result in a comparison mismatch on both the Pos_sample_c1 and the Neg_sample_c1.

As shown in FIG. 5C, the waveform diagram 500C shows a third case (3) that is associated with a transient fault scenario having an extra edge. In this instance, the waveform diagram 500C provides for a transient fault on the CLK with respect to an extra edge, wherein as shown in FIG. 5C, a transient fault on the CLK will result in a comparison mismatch on both the Pos_sample_c1 and the Neg_sample_c1.

As shown in FIG. 5D, the waveform diagram 500D shows a fourth case (4) that is associated with a stuck-at fault scenario. In this instance, the waveform diagram 500D provides for a stuck-at fault on the CLK, wherein as shown in FIG. 5D, a stuck-at fault on the CLK will result in the same value on all of the sampled values across C1 and C7.

Figure 6:
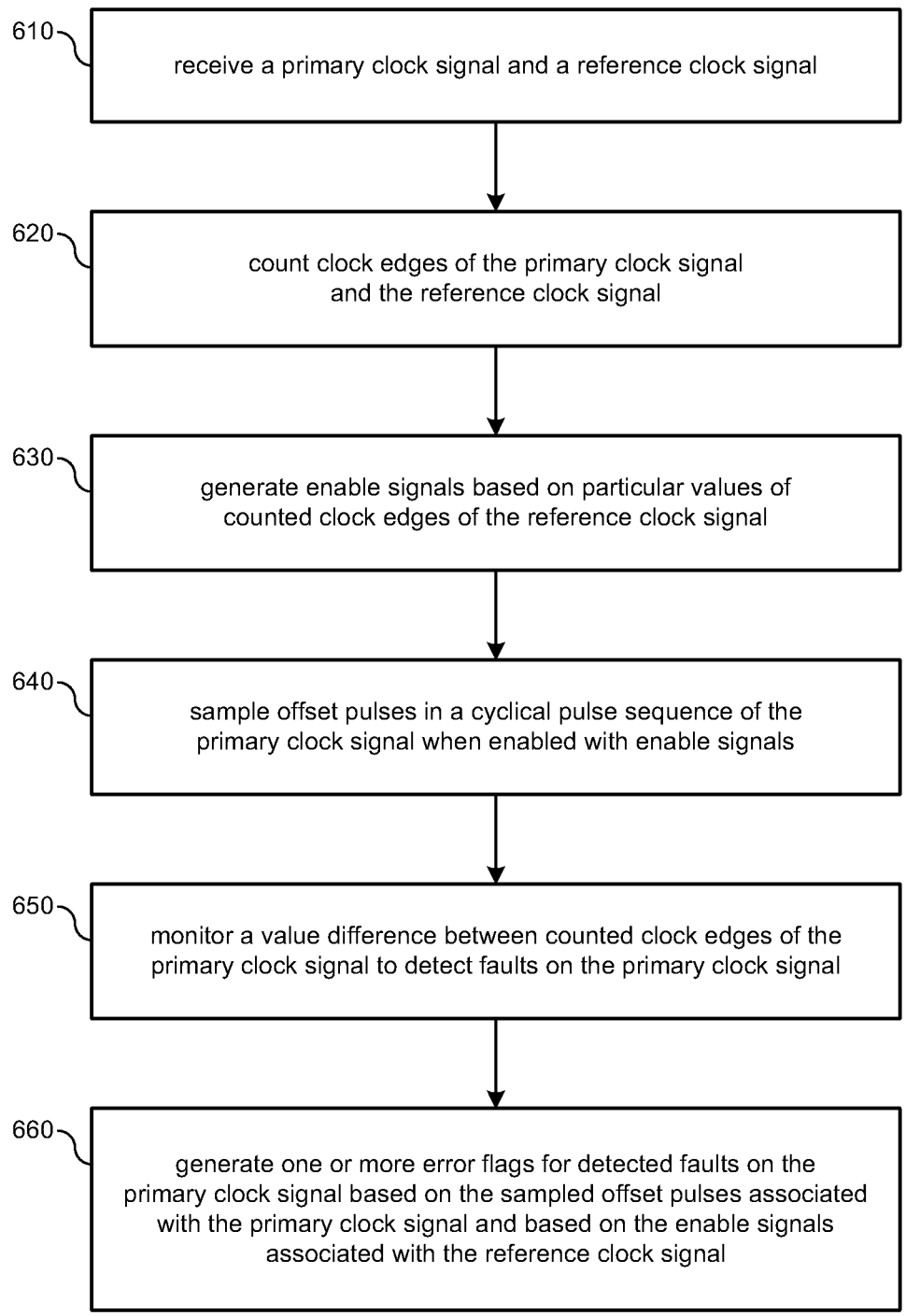
FIG. 6 illustrates a process flow diagram of method for providing clock circuitry with fault detection in accordance with implementations described herein.

FIG. 6 illustrates a process diagram of method 600 for providing clock circuitry with fault detection in accordance with implementations described herein.

It should be understood that even though method 600 indicates a particular order of operation execution, in some cases, various certain portions of the operations may be executed in a different order, and on different systems. In other cases, additional operations and/or steps may be added to and/or omitted from method 600. Also, method 600 may be implemented in hardware and/or software. If implemented in hardware, the method 600 may be implemented with various components and/or circuitry, as described herein in reference to FIGS. 1A-5D. Also, if implemented in software, method 600 may be implemented as a program or software instruction process configured for providing clock checker circuitry with fault detection, as described herein. Further, if implemented in software, instructions related to implementing the method 600 may be stored in memory and/or a database. For instance, a computer or various other types of computing devices having a processor and memory may be configured to perform method 600.

At block 610, method 600 may receive a primary clock signal (CLK) and receive a reference clock signal (CLK_CHK or REF_CLK), which is mesochronous with the primary clock signal (CLK). As such, the reference clock signal (CLK_CHK or REF_CLK) may have the same frequency as the primary clock signal (CLK), and the reference clock signal (CLK_CHK or REF_CLK) may have a different phase than the primary clock signal (CLK).

At block 620, method 600 may count clock edges of the primary clock signal (CLK) and count clock edges of the reference clock signal (CLK_CHK or REF_CLK). At block 630, method 600 may generate enable signals (EN_A_CLK, EN_B_CLK) based on particular values of counted clock edges of the reference clock signal (CLK_CHK or REF_CLK).

At block 640, method 600 may sample offset pulses (e.g., only samples a number value of 1 as bit sequence 001, and a number value of 7 as bit sequence 111) in a cyclical pulse sequence of the primary clock signal (CLK) when enabled with the enable signals (EN_A_CLK, EN_B_CLK). At block 650, method 600 may monitor a value difference between counted clock edges of the primary clock signal (CLK) to detect faults on the primary clock signal (CLK). The detected faults may include stuck-at faults and/or transient faults.

At block 660, method 600 may generate one or more error flags (Err_A, Err_B) for detected faults on the primary clock signal (CLK) based on the sampled offset pulses (A0[2:0], B0[2:0], C0[2:0], D0[2:0]) associated with the primary clock signal (CLK) and based on the enable signals (EN_A_CLK, EN_B_CLK) associated with the reference clock signal (CLK_CHK or REF_CLK). In various implementations, the one or more error flags (Err_A, Err_B) may include a first error flag (Err_A) that refers to stuck-at faults and a second error flag (Err_B) that refers to transient faults.

The various schemes and techniques described herein may have a number of advantages and benefits. For instance, in reference to high diagnostic coverage on a clock tree for the CLK, the various schemes and techniques described herein provide for detecting stuck-at faults and transient faults on the clock tree for the CLK to thereby achieve high overall diagnostic coverage metrics for functionally-safe (FuSa) systems. In reference to power and area savings on the clock tree for the CLK, the various schemes and techniques described herein provide for facilitating improved clock-tree methodology since the reference clock (CLK_CHK) need not be skew-balanced with respect to the primary clock (CLK), which enables more optimized clock tree buffers for improved power/area metrics.

Described herein are various implementations of an integrated circuit. The integrated circuit may include first clock circuitry that receives a first clock signal and provides sampled offset pulses associated with the first clock signal when enabled with enable signals. The integrated circuit may include second clock circuitry that receives a second clock signal and provides the enable signals to the first clock circuitry based on the second clock signal. The integrated circuit may include fault detector circuitry that receives the sampled offset pulses from the first clock circuitry, receives the enable signals from the second clock circuitry, and provides one or more error flags for detected faults of the first clock signal based on the sampled offset pulses from the first clock circuitry and based on the enable signals from the second clock circuitry.

Described herein are various implementations of an integrated circuit. The integrated circuit may include primary clock circuitry that receives a primary clock signal, uses multiple counters to count clock edges of the primary clock signal, uses multiple samplers to sample offset pulses in a cyclical pulse sequence of the primary clock signal, and provides sampled offset pulses when enabled with enable signals. The integrated circuit may include reference clock circuitry that receives a reference clock signal, uses a reference counter to count clock edges of the reference clock signal, generates the enable signals based on particular values of counted clock edges of the reference clock signal, and provides the enable signals to the primary clock circuitry. The integrated circuit may include fault detector circuitry that receives the sampled offset pulses from the primary clock circuitry, receives the enable signals from the reference clock circuitry, monitors a value difference between counted clock edges from the multiple counters to detect faults on the primary clock signal, and provides one or more error flags for detected faults on the primary clock signal based on the sampled offset pulses from the primary clock circuitry and based on the enable signals from the reference clock circuitry.

Described herein are various implementations of a method. The method may include receiving a primary clock signal and a reference clock signal. The method may include counting clock edges of the primary clock signal and the reference clock signal. The method may include generating enable signals based on particular values of counted clock edges of the reference clock signal. The method may include sampling offset pulses in a cyclical pulse sequence of the primary clock signal when enabled with the enable signals. The method may include monitoring a value difference between counted clock edges of the primary clock signal to detect faults on the primary clock signal. The method may include generating one or more error flags for detected faults on the primary clock signal based on the sampled offset pulses associated with the primary clock signal and based on the enable signals associated with the reference clock signal.

It should be intended that subject matter of the claims not be limited to the various implementations and illustrations provided herein, but include various modified forms of those implementations including portions of implementations and combinations of elements of different implementations in accordance with the claims. It should be appreciated that in the development of any such implementation, as in any engineering or design project, numerous implementation-specific decisions should be made to achieve developers' specific goals, such as compliance with system-related and business related constraints, which may vary from one implementation to another. It should also be appreciated that such a development effort may be complex and time consuming, but would nevertheless be a routine undertaking of design, fabrication, and manufacture for those having ordinary skill to benefit from various aspects of this disclosure.

Reference has been made in detail to various implementations, examples of which are illustrated in the accompanying drawings and figures. In the following detailed description, numerous specific details are set forth to provide a thorough understanding of the disclosure provided herein. However, the disclosure provided herein may be practiced without these specific details. In some other instances, well-known methods, procedures, components, circuits and networks have not been described in detail so as not to unnecessarily obscure details of the embodiments.

It should also be understood that, although the terms first, second, etc. may be used herein to describe various elements, these elements should not be limited by these terms. These terms are only used to distinguish one element from another. For example, a first element could be termed a second element, and, similarly, a second element could be termed a first element. The first element and the second element are both elements, respectively, but they are not to be considered the same element.

The terminology used in the description of the disclosure provided herein is for the purpose of describing particular implementations and is not intended to limit the disclosure provided herein. As used in the description of the disclosure provided herein and appended claims, the singular forms "a," "an," and "the" are intended to include the plural forms as well, unless the context clearly indicates otherwise. The term "and/or" as used herein refers to and encompasses any and all possible combinations of one or more of the associated listed items. The terms "includes," "including," "comprises," and/or "comprising," when used in this specification, specify a presence of stated features, integers, steps, operations, elements, and/or components, but do not preclude the presence or addition of one or more other features, integers, steps, operations, elements, components and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context. The terms "up" and "down"; "upper" and "lower"; "upwardly" and "downwardly"; "below" and "above"; and other similar terms indicating relative positions above or below a given point or element may be used in connection with some implementations of various technologies described herein.

While the foregoing is directed to implementations of various techniques described herein, other and further implementations may be devised in accordance with the disclosure herein, which may be determined by the claims that follow.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An integrated circuit, comprising:
    first clock circuitry that receives a first clock signal and provides sampled offset pulses associated with the first clock signal when enabled with enable signals;
    second clock circuitry that receives a second clock signal and provides the enable signals to the first clock circuitry based on the second clock signal; and
    fault detector circuitry that receives the sampled offset pulses from the first clock circuitry, receives the enable signals from the second clock circuitry, and provides one or more error flags for detected faults of the first clock signal based on the sampled offset pulses from the first clock circuitry and based on the enable signals from the second clock circuitry.

2. The integrated circuit of claim 1, wherein the first clock signal refers to a primary clock signal, and wherein the second clock signal refers to a reference clock signal, and wherein the reference clock signal is mesochronous with the primary clock signal.

3. The integrated circuit of claim 1, wherein the second clock signal has the same frequency as the first clock signal, and wherein the second clock signal has a different phase than the first clock signal.

4. The integrated circuit of claim 1, wherein the detected faults include stuck-at faults, and wherein the one or more error flags include a first error flag that refers to the stuck-at faults.

5. The integrated circuit of claim 1, wherein the detected faults include transient faults, and wherein the one or more error flags include a second error flag that refers to the transient faults.

6. The integrated circuit of claim 1, wherein the first clock circuitry comprises:
    multiple counters that count clock edges of the first clock signal; and
    multiple samplers that sample offset pulses in a cyclical pulse sequence of the first clock signal and provide the sampled offset pulses to the fault detector circuitry when enabled with the enable signals.

7. The integrated circuit of claim 6, wherein the second clock circuitry comprises:
    a reference counter that counts clock edges of the second clock signal, generates the enable signals based on particular values of the counted clock edges of the second clock signal, and provides the enable signals to the first clock circuitry.

8. The integrated circuit of claim 7, wherein the fault detector circuitry monitors a value difference between the counted clock edges from the multiple counters to detect faults on the first clock signal, and provides the one or more error flags for detected faults based on the sampled offset pulses from the first clock circuitry and based on the enable signals from the second clock circuitry.

9. An integrated circuit, comprising:
    primary clock circuitry that receives a primary clock signal, uses multiple counters to count clock edges of the primary clock signal, uses multiple samplers to sample offset pulses in a cyclical pulse sequence of the primary clock signal, and provides sampled offset pulses when enabled with enable signals;
    reference clock circuitry that receives a reference clock signal, uses a reference counter to count clock edges of the reference clock signal, generates the enable signals based on particular values of counted clock edges of the reference clock signal, and provides the enable signals to the primary clock circuitry; and
    fault detector circuitry that receives the sampled offset pulses from the primary clock circuitry, receives the enable signals from the reference clock circuitry, monitors a value difference between counted clock edges from the multiple counters to detect faults on the primary clock signal, and provides one or more error flags for detected faults on the primary clock signal based on the sampled offset pulses from the primary clock circuitry and based on the enable signals from the reference clock circuitry.

10. The integrated circuit of claim 9, wherein the reference clock signal has the same frequency as the primary clock signal.

11. The integrated circuit of claim 9, wherein the reference clock signal has a different phase than the primary clock signal.

12. The integrated circuit of claim 9, wherein the detected faults include stuck-at faults, and wherein the one or more error flags include a first error flag that refers to the stuck-at faults.

13. The integrated circuit of claim 9, wherein the detected faults include transient faults, and wherein the one or more error flags include a second error flag that refers to the transient faults.

14. The integrated circuit of claim 9, further comprising:
    a primary clock generator that generates the primary clock signal and the reference clock signal that is different than the primary clock signal.

15. The integrated circuit of claim 9, further comprising:
    a primary clock generator that generates the primary clock signal; and
    a reference clock generator that generates the reference clock signal that is different than the primary clock signal.

16. The integrated circuit of claim 9, wherein:
    the multiple counters of the primary clock circuitry include a first N-bit gray counter and a second N-bit gray counter, the cyclical pulse sequence of the primary clock signal has an M-value cyclical pulse sequence that is gray-coded with a gray count by the multiple counters, and the offset pulses refer to a gray count pulse sequence having a first N-bit pulse sequence and a second N-bit pulse sequence.

17. The integrated circuit of claim 16, wherein N=3, and wherein M=8, and wherein the first 3-bit pulse sequence is 001 with a first binary value of 1, and wherein the second 3-bit pulse sequence is 111 with a second binary value of 7.

18. The integrated circuit of claim 17, wherein:

the first 3-bit gray counter senses a positive clock edge of the first 3-bit pulse sequence, senses a positive clock edge of the second 3-bit pulse sequence, counts each positive clock edge of the first 3-bit pulse sequence in each repeating 8-value cyclical pulse sequence, and counts each positive clock edge of the second 3-bit pulse sequence in each repeating 8-value cyclical pulse sequence, and the second 3-bit counter senses a negative clock edge of the first 3-bit pulse sequence, senses a negative clock edge of the seventh-binary pulse sequence, counts each negative clock edge of the first 3-bit pulse sequence in each repeating 8-value cyclical pulse sequence, and counts each negative clock edge of the second 3-bit pulse sequence in each repeating 8-value cyclical pulse sequence.

19. The integrated circuit of claim 18, wherein:

the multiple samplers include a first sampler coupled to the first 3-bit gray counter that samples the first-binary pulse sequence of the offset pulses in the 8-value cyclical pulse sequence of the primary clock signal, the first sampler provides a first 3-bit sampled offset pulse of sampled offset pulses to the fault detector circuitry when enabled with a first enable signal of the enable signals, the multiple samplers include a second sampler coupled to the first 3-bit gray counter that samples the second 3-bit pulse sequence of the offset pulses in the 8-value cyclical pulse sequence of the primary clock signal, and the second sampler provides a second 3-bit sampled offset pulse of sampled offset pulses to the fault detector circuitry when enabled with a second enable signal of the enable signals.

20. The integrated circuit of claim 19, wherein:

the multiple samplers include a third sampler coupled to the second 3-bit gray counter that samples the first-binary pulse sequence of the offset pulses in the 8-value cyclical pulse sequence of the primary clock signal, the third sampler provides a first-binary sampled offset pulse of sampled offset pulses to the fault detector circuitry when enabled with a first enable signal of the enable signals, the multiple samplers include a fourth sampler coupled to the second 3-bit gray counter that samples the seventh-binary pulse sequence of the offset pulses in the 8-value cyclical pulse sequence of the primary clock signal, and the second sampler provides a seventh-binary sampled offset pulse of sampled offset pulses to the fault detector circuitry when enabled with a second enable signal of the enable signals.

21. The integrated circuit of claim 16, wherein:

the reference counter of the reference clock circuitry includes a third 3-bit gray counter, the reference clock signal has an 8-value cyclical pulse sequence that is gray-coded with a gray count by the reference counter, and the particular values of the counted clock edges refer to offset pulses of another gray count pulse sequence having the first-binary pulse sequence and the seventh-binary pulse sequence.

22. The integrated circuit of claim 21, wherein:

the third 3-bit gray counter senses a positive clock edge of the first-binary pulse sequence, senses a positive clock edge of the seventh-binary pulse sequence, counts each positive clock edge of the first-binary pulse sequence in each repeating 8-value cyclical pulse sequence, and counts each positive clock edge of the seventh-binary pulse sequence in each repeating 8-value cyclical pulse sequence.

23. The integrated circuit of claim 22, wherein:

the reference clock circuitry has first logic circuitry that provides a first enable signal of the enable signals to the primary clock circuitry and the fault detector circuitry for each positive clock edge of the first-binary pulse sequence, and the reference clock circuitry has second logic circuitry that provides a second enable signal of the enable signals to the primary clock circuitry and the fault detector circuitry for each positive clock edge of the seventh-binary pulse sequence.

24. The integrated circuit of claim 9, wherein the fault detector circuitry monitors the value difference between the counted clock edges from the multiple counters to detect faults on the primary clock signal by:

storing previous values of the counted clock edges from the multiple counters;

storing current values of the counted clock edges from the multiple counters; and comparing the previous values to the current values so as to determine the value difference between the counted clock edges from the multiple counters to detect the faults on the primary clock signal.

25. A method, comprising:

receiving a primary clock signal and a reference clock signal;

counting clock edges of the primary clock signal and the reference clock signal;

generating enable signals based on particular values of counted clock edges of the reference clock signal;

sampling offset pulses in a cyclical pulse sequence of the primary clock signal when enabled with the enable signals;

monitoring a value difference between counted clock edges of the primary clock signal to detect faults on the primary clock signal; and generating one or more error flags for detected faults on the primary clock signal based on the sampled offset pulses associated with the primary clock signal and based on the enable signals associated with the reference clock signal.

* * * * *